United States Patent
Bhatia et al.

(10) Patent No.: US 11,355,204 B2
(45) Date of Patent: Jun. 7, 2022

(54) EFFICIENT READ-THRESHOLD CALCULATION METHOD FOR PARAMETRIC PV-LEVEL MODELING

(71) Applicant: SK hynix Inc., Icheon-si (KR)

(72) Inventors: Aman Bhatia, Los Gatos, CA (US); Haobo Wang, Sunnyvale, CA (US); Fan Zhang, Fremont, CA (US)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/011,983

(22) Filed: Sep. 3, 2020

(65) Prior Publication Data
US 2022/0068401 A1    Mar. 3, 2022

(51) Int. Cl.
*G11C 16/26*    (2006.01)
*G11C 16/34*    (2006.01)
*H01L 27/11556*    (2017.01)

(52) U.S. Cl.
CPC .......... *G11C 16/26* (2013.01); *G11C 16/3404* (2013.01); *H01L 27/11556* (2013.01)

(58) Field of Classification Search
CPC ................ G11C 16/26; G11C 16/3404; H01L 27/11556
See application file for complete search history.

(56) References Cited

U.S. PATENT DOCUMENTS

| | | | |
|---|---|---|---|
| 8,116,141 B2 * | 2/2012 | Yoo | G11C 16/26 365/185.24 |
| 8,369,141 B2 | 2/2013 | Sommer et al. | |
| 8,605,502 B1 | 12/2013 | Desireddi et al. | |
| 8,885,415 B2 | 11/2014 | Chilappagari et al. | |
| 8,898,553 B1 * | 11/2014 | Varnica | H03M 13/612 714/794 |
| 8,913,437 B2 * | 12/2014 | Chilappagari | G11C 16/34 365/185.24 |
| 8,990,665 B1 | 3/2015 | Steiner et al. | |
| 9,069,659 B1 | 6/2015 | Sabbag et al. | |

(Continued)

OTHER PUBLICATIONS

Wang, et al., "DNN-Aided Read-Voltage Threshold Optimization for MLC Flash Memory with Finite Block Length", Mathematics, Computer Science, arXiv:2004.05340v1, Apr. 11, 2020, 10 pages.

(Continued)

*Primary Examiner* — Tri M Hoang
(74) *Attorney, Agent, or Firm* — Weaver Austin Villeneuve & Sampson LLP

(57) ABSTRACT

Techniques related to methods and systems for improving a performance related to reading data stored in memory cells. The method includes selecting a first voltage read range and a second voltage read range from multiple voltage read ranges that are associated with a number of bits storable in a memory cell. The method includes receiving, a first set of parameters that represent a first probability distribution of first candidate voltage read thresholds within the first voltage read range. The method includes receiving a second set of parameters that represent a second probability distribution of second candidate voltage read thresholds within the second voltage read range. The method includes generating, based on an input to an objective function, a voltage read threshold. The method includes reading data stored in the memory cell based on the voltage read threshold.

20 Claims, 12 Drawing Sheets

(56) References Cited

U.S. PATENT DOCUMENTS

| | | | |
|---|---|---|---|
| 9,330,775 B2* | 5/2016 | Kim | G11C 16/28 |
| 9,542,258 B1 | 1/2017 | Lu et al. | |
| 9,589,673 B1 | 3/2017 | Zhang et al. | |
| 9,728,263 B2 | 8/2017 | Sharon et al. | |
| 9,905,289 B1 | 2/2018 | Jeon et al. | |
| 10,216,422 B2 | 2/2019 | Kim et al. | |
| 10,236,067 B2 | 3/2019 | Fisher et al. | |
| 10,276,247 B2* | 4/2019 | Alhussien | H03M 13/6325 |
| 10,290,358 B2* | 5/2019 | Alhussien | H03M 13/1108 |
| 10,573,389 B2* | 2/2020 | Kim | G06K 9/6223 |
| 10,726,934 B2 | 7/2020 | Chew et al. | |
| 10,877,827 B2 | 12/2020 | Miladinovic | |
| 2011/0228583 A1 | 9/2011 | Noguchi et al. | |
| 2012/0236638 A1 | 9/2012 | Weingarten et al. | |
| 2013/0176775 A1 | 7/2013 | Tang et al. | |
| 2019/0004734 A1 | 1/2019 | Kirshenbaum et al. | |
| 2019/0026076 A1 | 1/2019 | Leng et al. | |
| 2019/0115078 A1 | 4/2019 | Kim et al. | |
| 2019/0156180 A1 | 5/2019 | Nomura et al. | |
| 2019/0172542 A1 | 6/2019 | Miladinovic | |
| 2019/0279728 A1 | 9/2019 | Kodama et al. | |
| 2020/0066353 A1 | 2/2020 | Pletka et al. | |
| 2020/0210096 A1 | 7/2020 | Kim et al. | |
| 2020/0210831 A1 | 7/2020 | Zhang et al. | |
| 2020/0234772 A1 | 7/2020 | Halperin et al. | |
| 2020/0265903 A1 | 8/2020 | Kim et al. | |
| 2020/0303016 A1 | 9/2020 | Amada | |
| 2021/0082528 A1 | 3/2021 | Takizawa et al. | |
| 2021/0264983 A1 | 8/2021 | Lemke et al. | |
| 2021/0375364 A1 | 12/2021 | Liikanen et al. | |

OTHER PUBLICATIONS

Notice of Allowance dated Mar. 8, 2022 in U.S. Appl. No. 17/157,495.

* cited by examiner

SLC 310

- L0: 1
- L1: 0

MLC 320

- L0: 11
- L1: 10
- L2: 01
- L3: 00

TLC 330

- L0: 111
- L1: 110
- L2: 101
- L3: 100
- L4: 011
- L5: 010
- L6: 001
- L7: 000

QLC 340

EFFICIENT READ-THRESHOLD CALCULATION METHOD FOR PARAMETRIC PV-LEVEL MODELING

BACKGROUND

In NAND flash memory, memory cells can store one or more bits as voltage values. For example, a single level cell stores one bit and the measured voltage value can be compared to a single voltage threshold to determine a logical value of the bit (e.g., a "0" or a "1"). A multi-level cell (MLC) can store two bits and the measured voltage value can be compared to three voltage thresholds to determine the logical value of each bit. Generally, the logical value stored in a memory cell is determined by a voltage range between each of the three voltage thresholds (e.g., 1-2V, 2-3V, 3-4V, etc.) in which the cell's threshold voltage lies. As more bits per memory cell are stored, the threshold voltage ranges become smaller, resulting in increased error rates in determining the memory cell's value.

Error-correction codes (ECCs) are typically used for various types of data storage devices including NAND flash memories. ECCs are also frequently used during the process of data transmission. ECC refers to codes that add redundant data, or parity data, to a message, such that the message can be recovered by a receiver even when a number of errors were introduced, either during the process of transmission, or storage. In general, the ECC can correct the errors up to the capability of the code being used. ECC decoding can include hard decoding, such as Bose-Chaudhuri-Hocquenghem (BCH) decoding, where the logical value stored in a memory cell is determined by the voltage range in which the cell's threshold voltage lies. ECC decoding can also include soft decoding, such as Low-density parity-check code (LDPC) decoding, where the logical value stored in a memory cell is represented as a probability distribution.

The accuracy of read threshold voltage is critical for storage devices, including solid state drives using NAND flash memory technology, because a better read threshold voltage results in a lower raw bit error rate (RBER), which determines SSD system performance such as input/output operations per second (IOPs) and throughput. However, during the life time of a storage device, the optimal read threshold voltage for a memory cell can change depending on a large number of variable factors. Theoretically, if all the factors affecting the change to a read threshold voltage are known, the optimal read threshold can be determined from offline memory characterization. For example, a look-up table can be generated, where the table associates optimal read thresholds with possible combinations of the variable factors under different realizations of these factors. However, such a table is practically challenging to implement in part because it would need a huge number of realizations and likely does not result in optimal voltage read thresholds because not all possible combinations and realizations can be determined offline.

BRIEF SUMMARY

Techniques related to improving a performance related to generating a voltage read range are described. The techniques involve a computer system for reading data from storage and implement methods on such a computer system. In an example, the computer system includes a processor and a memory communicatively coupled with the processor. The memory is configured to store client data, a voltage read range generator, and computer-readable instructions. The voltage read range generator receives a first set of parameters that represent a first probability distribution within a first voltage read range and a second set of parameters that represent a second probability distribution within a second voltage read range. The computer-readable instructions upon execution by the processor configure the computer system to perform operations. The operations include generating a voltage read threshold based on inputs to an objective function and the first voltage read range and second voltage read range.

In one example, a methods for improving a performance related to reading data stored in memory cells is disclosed. The method includes selecting a first voltage read range and a second voltage read range from multiple voltage read ranges that are associated with a number of bits storable in a memory cell. The method includes receiving a first set of parameters that represent a first probability distribution of first candidate voltage read thresholds within the first voltage read range. The method includes receiving a second set of parameters that represent a second probability distribution of second candidate voltage read thresholds within the second voltage read range. The method includes generating, based on an input to an objective function, a voltage read threshold. The method includes reading data stored in the memory cell based on the voltage read threshold.

This illustrative example is mentioned not to limit or define the disclosure, but to provide an example to aid understanding thereof. Additional embodiments and examples are discussed in the Detailed Description, and further description is provided there.

BRIEF DESCRIPTION OF THE DRAWINGS

An understanding of the nature and advantages of various embodiments may be realized by reference to the following figures.

FIG. 3 illustrates an example of bit storage in NAND flash memories, in accordance with certain embodiments of the present disclosure.

DETAILED DESCRIPTION

Figure 1:
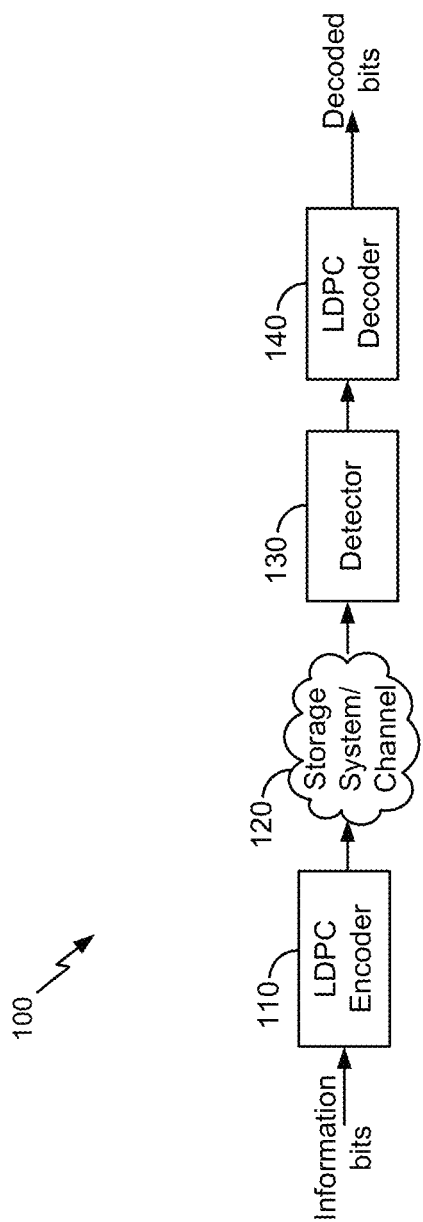
FIG. 1 illustrates an example of a high level block diagram of an error correcting system, in accordance with certain embodiments of the present disclosure.

Techniques related to improving a performance related to generating a voltage read threshold are described. The techniques involve a computer system for reading data from storage and implement methods on such a computer system. In an example, the computer system includes a processor and a memory communicatively coupled with the processor. The memory is configured to store client data, a voltage read threshold generator, and computer-readable instructions. The voltage read range generator receives a first set of parameters that represent a first probability distribution within a first voltage read range and a second set of parameters that represent a second probability distribution within a second voltage read range. The computer-readable instructions upon execution by the processor configure the computer system to perform operations. The operations include generating a voltage read threshold based on inputs to an objective function and the first voltage read range and second voltage read range. The first voltage read range represents a first set of bit values. For instance, a voltage level of a memory cell that is read to be smaller than the voltage read threshold, the bits of the memory cells are determined to have the first bit values and these bits represent the data stored in the memory cell. The second voltage read range represents a second set of bit values. For instance, a voltage level of a memory cell that is read to be greater than the voltage read threshold, the bits of the memory cells are determined to have the second bit values and these bits represent the data stored in the memory cell.

To illustrate, consider an example of a NAND flash memory using triple-level cell (TLC) technology, where each memory cell stores three bits of data. Eight voltage read thresholds are needed to determine the logical values of the three bits stored in a memory cell. Memory cells can be organized in a most significant bit (MSB) page, a least significant bit (LSB) page, and a central significant bit (CSB) page within a block of a die of the NAND flash memory. Three of the eight voltage read thresholds are associated with the MSB page, two of the eight voltage read thresholds are associated with the LSB page, and the remaining two of the eight voltage read thresholds are associated with the CSB page.

In this example, the voltage read thresholds associated with a page are associated with the program verify (PV) level that indicates the values of the bits. Each of these PV levels has a probability distribution that a voltage corresponds to the PV-level. When reading data from the memory cell, the read voltage can be represented by a position on one of the probability distribution for a respective PV levels. For instance, in a three-bit memory cell, there are PV levels 0-7 which correspond to "000", "001" and the like up to bit values of "111." Some probability distributions of a particular PV level may overlap an adjacent PV level that may cause bit errors when reading the data associated with the PV level. The voltage read threshold generator can determine a voltage read threshold using an objective function and sets of parameters that describe the probability distribution for each adjacent PV level. The computer system can read data from the memory location using the voltage read threshold that is generated.

The embodiments of the present disclosure provide several advantages related to computer storage. For example, the embodiments provide better voltage read thresholds relative to existing systems (e.g., for existing systems that do not change these thresholds or change them using a predefined table). The better read thresholds result in a lower raw bit error rate (RBER) that, in turn, improves the performance of the data storage device, including IOPs and throughput. Using the methods described herein reduce the MAC operations by approximately 3000× and provide a similar level of savings in load-store operations.

In the interest of clarity of explanation, the embodiments of the present disclosure are described in connection with LDPC codewords and NAND flash memories. However, the embodiments are not limited as such and apply to any other encoding decoding procedures and any other type of data storage.

FIG. 1 illustrates an example of a high level block diagram of an error correcting system 100, in accordance with certain embodiments of the present disclosure. In the example, LDPC codes are described in connection with data storage. However, the embodiments of the present disclosure are not limited as such. Instead, the embodiments similarly apply to other usage of LDPC codes including, for example, data transmission.

LDPC codes are linear block codes defined by a sparse parity-check matrix H, which consists of zeros and ones. The term "sparse matrix" is used herein to refer to a matrix in which a number of non-zero values in each column and each row is much less than its dimension. The term "column weight" is used herein to refer to the number of non-zero values in a specific column of the parity-check matrix H. The term "row weight" is used herein to refer to number of non-zero values in a specific row of the parity-check matrix H. In general, if column weights of all of the columns in a parity-check matrix corresponding to an LDPC code are similar, the code is referred to as a "regular" LDPC code. On the other hand, an LDPC code is called "irregular" if at least one of the column weights is different from other column weights. Usually, irregular LDPC codes provide better error correction capability than regular LDPC codes.

The LDPC codes are also described according to the way they are constructed. Random computer searches or algebraic constructions are possible. The random computer search construction describes an LDPC code having a parity-check matrix designed by a random computer-based procedure. Algebraic construction implies that the parity-check matrix has been constructed based on combinatorial methods. Quasi-cyclic LDPC (QC-LDPC) codes fall under the latter construction method. One advantage of QC-LDPC codes is that they have a relatively easier implementation in terms of the encoding procedure. The main feature of QC-LDPC codes is that the parity-check matrix consists of circulant submatrices, which could be either based on an identity matrix or a smaller random matrix. Permutation vectors could also be used in order to create the circulant submatrices.

As illustrated, an LDPC encoder 110 receives information bits that include data which is desired to be stored in a storage system 120. LDPC encoded data is output by the LDPC encoder 110 and is written to the storage 120.

In various embodiments, the storage 120 may include a variety of storage types or media such as (e.g., magnetic, solid state) disk drive storage, flash storage, etc. In some embodiments, the techniques are employed in a transceiver and instead of being written to or read from storage, the data is transmitted and received over a wired and/or wireless channel. In this case, the errors in the received codeword may be introduced during transmission of the codeword.

When the stored data is requested or otherwise desired (e.g., by an application or user which stored the data), a detector 130 receives data from the storage system 120. The received data may include some noise or errors. The detector 130 performs detection on the received data and outputs decision and/or reliability information. For example, a soft output detector outputs reliability information and a decision for each detected bit (e.g., a logical value of "1" or "0"). On the other hand, a hard output detector outputs a decision on each bit without providing corresponding reliability information. As an example, a hard output detector may output a decision that a particular bit is a "1" or a "0" without indicating how certain or sure the detector is in that decision. In contrast, a soft output detector outputs a decision and reliability information associated with the decision. In general, a reliability value indicates how certain the detector is in a given decision. In one example, a soft output detector outputs a log-likelihood ratio (LLR) where the sign indicates the decision (e.g., a positive value corresponds to a "1" decision and a negative value corresponds to a "0" decision) and the magnitude indicates how sure or certain the detector is in that decision (e.g., a large magnitude indicates a high reliability or certainty).

The decision and/or reliability information is passed to a LDPC decoder 140 which performs LDPC decoding using the decision and reliability information. A soft input decoder utilizes both the decision and the reliability information to decode the codeword. A hard decoder utilizes only the decision values in the decoder to decode the codeword. The decoded bits generated by the LDPC decoder 140 are passed to the appropriate entity (e.g., the user or application which requested it). With proper encoding and decoding, the information bits match the decoded bits.

In various embodiments, the system shown may be implemented using a variety of techniques including an application-specific integrated circuit (ASIC), a field-programmable gate array (FPGA), and/or a general purpose processor (e.g., an Advanced RISC Machine (ARM) core).

LDPC codes are usually represented by bipartite graphs. One set of nodes, the variable or bit nodes correspond to elements of the codeword and the other set of nodes, e.g., check nodes, correspond to the set of parity-check constraints satisfied by the codeword. Typically, the edge connections are chosen at random. The error correction capability of an LDPC code is improved if cycles of short length are avoided in the graph. In a (r,c) regular code, each of the n variable nodes (V1, V2, . . . , Vn) has connections to r check nodes and each of the m check nodes (C1, C2, . . . , Cm) has connections to c bit nodes. In an irregular LDPC code, the check node degree is not uniform. Similarly, the variable node degree is not uniform. In QC-LDPC codes, the parity-check matrix H is structured into blocks of p×p matrices such that a bit in a block participates in only one check equation in the block, and each check equation in the block involves only one bit from the block. In QC-LDPC codes, a cyclic shift of a codeword by p results in another codeword. Here p is the size of square matrix which is either a zero matrix or a circulant matrix. This is a generalization of a cyclic code in which a cyclic shift of a codeword by 1 results in another codeword. The block of p×p matrix can be a zero matrix or cyclically shifted identity matrix of size p×p.

A message passing algorithm is generally used to decode LDPC codes. Several variations of the message passing algorithm exist in the art, such as min-sum (MS) algorithm, sum-product algorithm (SPA) or the like. Message passing uses a network of variable nodes and check nodes. The connections between variable nodes and check nodes are described by and correspond to the values of the parity-check matrix.

In an example, a hard decision message passing algorithm may be performed. In a first step, each of the variable nodes sends a message to one or more check nodes that are connected to it. In this case, the message is a value that each of the variable nodes believes to be its correct value.

In the second step, each of the check nodes calculates a response to send to the variable nodes that are connected to it using the information that it previously received from the variable nodes. This step can be referred as the check node update (CNU). The response message corresponds to a value that the check node believes that the variable node should have based on the information received from the other variable nodes connected to that check node. This response is calculated using the parity-check equations which force the values of all the variable nodes that are connected to a particular check node to sum up to zero (modulo 2).

At this point, if all the equations at all the check nodes are satisfied, the decoding algorithm declares that a correct codeword is found and it terminates. If a correct codeword is not found, the iterations continue with another update from the variable nodes using the messages that they received from the check nodes to decide if the bit at their position should be a zero or a one by a majority rule. The variable nodes then send this hard decision message to the check nodes that are connected to them. The iterations continue until a correct codeword is found, a certain number of iterations are performed depending on the syndrome of the codeword (e.g., of the decoded codeword), or a maximum number of iterations are performed without finding a correct codeword. It should be noted that a soft-decision decoder works similarly, however, each of the messages that are passed among check nodes and variable nodes, also include reliability of each bit.

In another example, a soft message passing algorithm may be performed. In this example, L(qij) represents a message that is sent by variable node $v_i$ to check node $c_j$; L($r_{ji}$) represents the message sent by check node $c_j$ to variable node $v_i$; and L($c_i$) represents initial LLR value for each variable node $v_i$. Variable node processing for each L(qij) can be done through the following steps:

(1) Read L($c_i$) and L($r_{ji}$) from memory.

(2) Calculate L(Qi-sum)=L($c_i$)+Scaling Factor*$\Sigma_{j \in c_i}$L($r_{ij}$).

(3) Calculate each L(Qi-sum)−L($r_{ij}$).

(4) Output L(Qi-sum) and write back to memory.

(5) If this is not the last column of the memory, go to Step 1 and increment i by one.

(6) Compute parity-check-sums (e.g., syndrome), if they are all equal to zero, the number of iterations reaches a threshold and the parity-check-sums are greater than another threshold, or the number of iterations equals a maximum limit, stop; otherwise, perform check node processing.

Check node processing for each L(rji) can be performed as follows:
(1) Read one row of qij from memory.
(2) Calculate L(Rj-sum) as follows:

$$L(Rj\text{-sum}) = (\Pi_{i' \in R_j} \alpha_{i'j}) \phi(\Sigma_{i' \in R_j} \phi(\beta_{i'j}))$$

$$\alpha_{ij} = \text{sign}(L(q_{ij})), \beta_{ij} = |L(q_{ij})|,$$

$$\phi(x) = -\log\left(\tanh\left(\frac{x}{2}\right)\right) = \log\left(\frac{e^x + 1}{e^x - 1}\right)$$

(3) Calculate the individual $L(r_{ji}) = (\Pi_{i' \in j\backslash i} \alpha_{i'j}) \phi(\Sigma_{i' \in j\backslash i} \phi(\beta_{i'j}))$ for check nodes.
(4) Write back $L(r_{ji})$ to memory.
(5) If this is not the last row of memory, then go to the first step and increment j by one.

Figure 2:
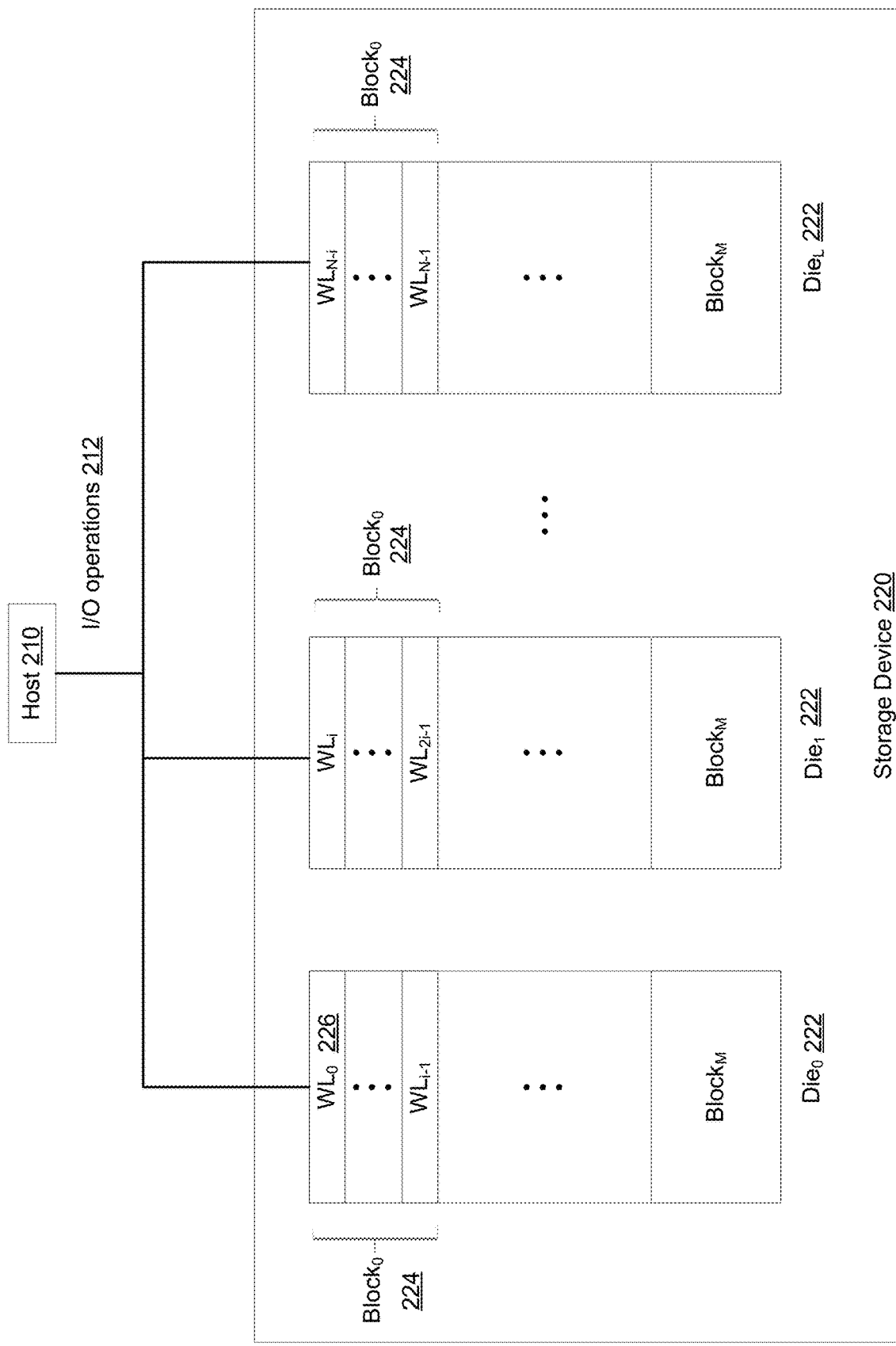
FIG. 2 illustrates an example of a computer system that includes a host and a storage device, in accordance with certain embodiments of the present disclosure.

FIG. 2 illustrates an example of a computer system that includes a host 210 and a storage device 220, in accordance with certain embodiments of the present disclosure. The host 210 performs I/O operations 212 including writing data to the storage device 220 and reading data from the storage device 220. In an example, writing the data includes encoding the data with one or more LDPC encoders (not shown in FIG. 2) to generate LDPC codewords that are stored in the storage device 220. Reading the data includes decoding the LDPC codewords with one or more LDPC decoders (not shown in FIG. 2) to output decoded data from the storage device 220. The encoding and decoding (e.g., the LDPC encoder(s) and decoder(s)) are part of an ECC system that can be implemented between the host 210 and the storage device 220.

In an example, the storage device 220 includes a number of memory dies 222 (this number is shown as "L" in FIG. 2). In turn, each memory die 222 contains memory cells that can be organized in a number of blocks 224 (this number is shown as "M" in FIG. 2). Each of the blocks 224 contains a number of wordlines 226 (this number is shown as "i" in FIG. 2). The memory cells may be floating-gate transistors such as floating-gate MOSFETs. The memory cells may be grouped and/or referenced using a wide range of configurations, including columns, bitlines, pages, and wordlines. Other groupings of memory cells 102 are also possible, including groupings across different chips, dies, planes, among others. In some embodiments, a page of a block can represent a minimum programmable unit and a minimum readable unit.

For NAND flash, each block 224 contains sixty-four pages for a single-level cell (SLC) flash, one-hundred twenty-eight pages for a multi-level cell (MLC) flash, three-hundred eighty-four pages triple-level cell (TLC) flash. The size of a page can range from 2 KB to 8 KB. In MLC flash, the two bits within a single cell are not mapped to the same page. Rather, the collection of most significant bits (MSBs) from a group of cells form a page called the MSB page. The least significant bits (LSBs) from the same group of cells form a page called the LSB page. Similarly, for TLC, MSB and LSB pages exist. In addition, bits that are from the same group and that are between the MSBs and LSBs form a page called the central significant bit (CSB) page.

In some instances, one or more components of the storage device 220 may become unusable due to failure prior to or during operation of storage device 220. Causes of a failure may be due to defects during the manufacturing process, mechanical stress to the storage device 220 prior to or during use, degradation of the dielectric material in memory cells, among others. Failures may occur at the memory cell level, which may propagate and cause failures within other components of the storage device 220. A group of memory cells can be considered to fail when no data from any one of the memory cells in the group is writable and/or readable. Additionally or alternatively, a group may be considered to fail when at least one of the memory cells in the group is neither writable and/or readable. In such instances, an EEC scheme (e.g., a combination of an ECC encoding procedure and an ECC decoding procedure) is usable to protect and/or recover the data in the failed group.

FIG. 3 illustrates an example of bit storage in NAND flash memories, in accordance with certain embodiments of the present disclosure. Four such memories are illustrated: a single-level cell (SLC) NAND flash memory 310, a multiple-level cell (MLC) NAND flash memory 320, a triple-level cell (TLC) NAND flash memory 330, and a quad-level cell (QLC) NAND flash memory 340. Generally, one or more bits are stored in a cell depending on the type of the NAND flash memory. The storage relies on a mapping that associates a logical value of a bit (e.g., whether a "0" or a "1") with a voltage level. A voltage level corresponds to a range of voltages (also referred to herein as a voltage range) such that, if a voltage is read as the voltage level and falls in the voltage range, this voltage level can be declared as belonging to the voltage range and the bits in the cell are determined to have the logical values that correspond to the voltage range.

Specific to the SLC NAND flash memory 310, one bit (e.g., an information bit or a parity bit) can be stored in a cell. Hence, there are two possible voltage levels for the cell. The mapping defines a voltage read threshold between these two levels. To check whether the cell contains a "0" or a "1," voltage is read and compared to the voltage read threshold to identify the relevant voltage level and, accordingly, the logical value of the bit. For instance, if the read voltage value is smaller than the voltage read threshold, the first voltage level is identified and the logical value of the bit is determined to be a "0." Otherwise, the second voltage level is identified and the logical value of the bit is determined to be a "1."

In comparison, for the MLC NAND flash memory 320, two bits can be stored in a cell. Hence, there are four possible voltage levels for the cell. The mapping defines three voltage read thresholds between these four levels. To check whether each bit contained in the cell is a "0" or a "1," voltage is read and compared to the three voltage read thresholds to identify the relevant voltage level and, accordingly, the logical values of the bits.

Similarly, for the TLC NAND flash memory 330 and QLC NAND flash memory 340, three bits and four bits, respectively, can be stored in a cell. Hence, there are eight and sixteen possible voltage levels for the cell for the TLC NAND flash memory 330 and QLC NAND flash memory 340, respectively. The mapping of TLC NAND flash memory 330 defines seven voltage read thresholds between the eight voltage levels. The mapping of QLC NAND flash memory 340 defines fifteen voltage read thresholds between the sixteen voltage levels. To check whether each bit contained in the cell is a "0" or a "1," voltage is read and compared to the voltage read thresholds to identify the relevant voltage level and, accordingly, the logical values of the bits.

Figure 4:
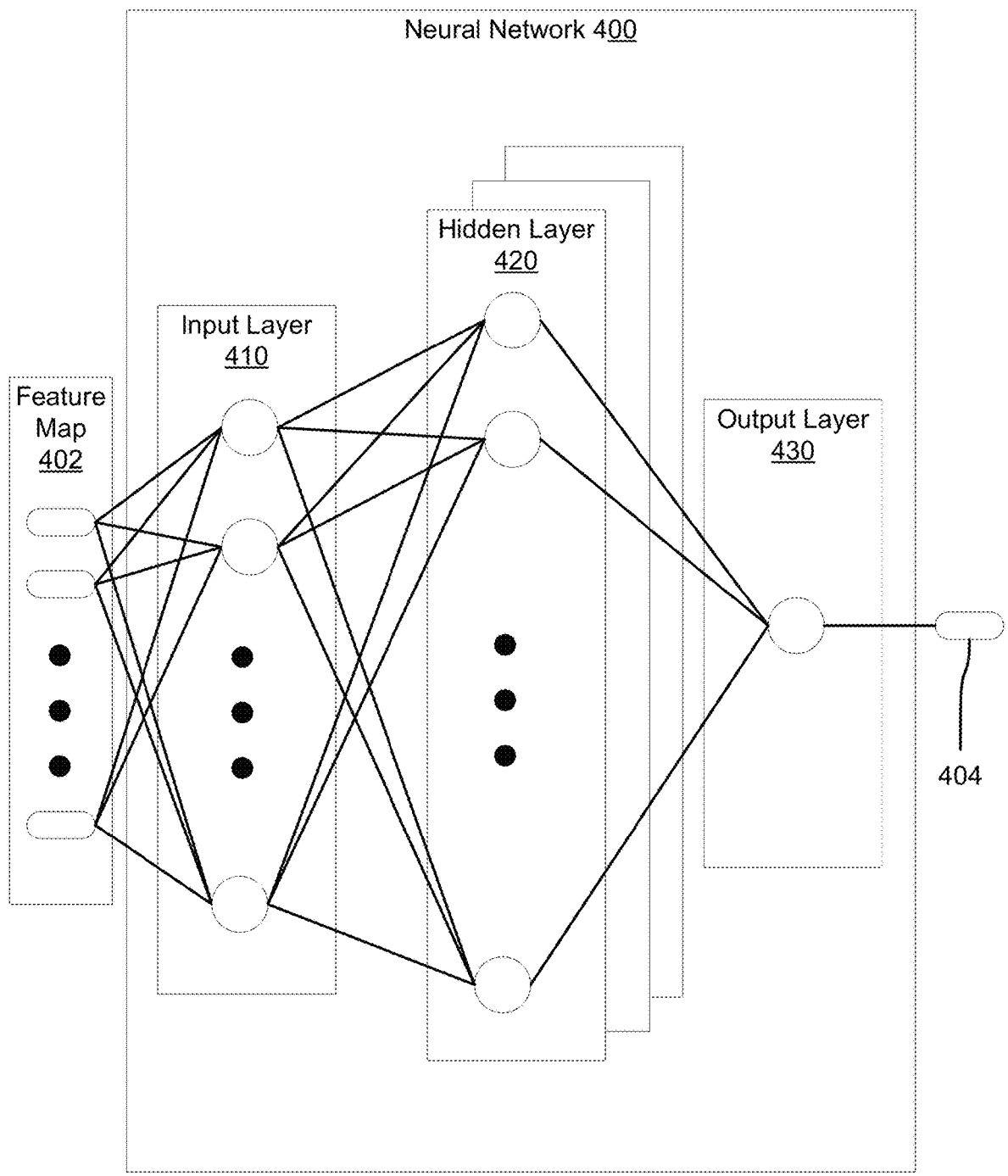
FIG. 4 illustrates an example of a computer system that includes a voltage read threshold generator, in accordance with certain embodiments of the present disclosure.

FIG. 4 illustrates an example of a neural network 400 that can be included in a computing system for generating a voltage read threshold, in accordance with certain embodiments of the present disclosure. A feature map 402, associated with one or more input conditions (e.g., the first cumulative distribution 502 or the second cumulative distribution 504), is input to the neural network 400. In turn, the neural network 400 outputs probability distribution parameters 404. As illustrated, the neural network 400 includes multiple layers. Features from the feature map 402 are connected to input nodes in an input layer 410 of the neural network 400. The probability distribution parameters 404 are generated from an output node of an output layer 430. One or more hidden layers 420 of the neural network 400 exist between the input layer 410 and the output layer 430. The neural network 400 is pre-trained to process the features from the feature map 402 through the different layers 410, 420, and 430 in order to output the probability distribution parameters 404. While described in additional detail with reference to FIG. 5, an example of probability distribution parameters is a set of parameters that describe characteristics (e.g., location scale w, and shape a) of a Skew Normal Distribution that models voltage ranges in a memory block.

In some embodiments, the neural network 400 is a multi-layer neural network that represents a network of interconnected nodes, such as an artificial deep neural network, where knowledge about the nodes (e.g., information about specific features represented by the nodes) is shared across layers and knowledge specific to each layer is also retained. Each node represents a piece of information. Knowledge can be exchanged between nodes through node-to-node interconnections. Input to the neural network 400 activates a set of nodes. In turn, this set of nodes activates other nodes, thereby propagating knowledge about the input. This activation process is repeated across other nodes until nodes in an output layer are selected and activated.

As illustrated, the neural network 400 includes a hierarchy of layers representing a hierarchy of nodes interconnected in a feed-forward way. The input layer 410 exists at the lowest hierarchy level, an input layer 410 exists. The input layer 410 includes a set of nodes that are referred to herein as input nodes. When the feature map 402 is input to the neural network 400, each of the input nodes of the input layer 410 is connected to each feature of the feature map. Each of the connections has a weight. These weights are one set of parameters that are derived from the training of the neural network 400. The input nodes transform the features by applying an activation function to these features. The information derived from the transformation are passed to the nodes at a higher level of the hierarchy.

The output layer 430 exists at the highest hierarchy level. The output layer 430 includes one or more output nodes. Each output node provides a specific value of a probability distribution parameter. The number of output nodes depends on the needed number of probability distribution parameters. For instance, if three probability distribution parameters are needed to determine the characteristics of a voltage range curve for a memory cell associated with the neural network 400, three output nodes are used, each generating and outputting one of the three probability distribution parameters. In other words, there is a one-to-one relationship or mapping between the number of output nodes and the number of probability distribution parameters.

The hidden layer(s) 420 exists between the input layer 410 and the output layer 430. The hidden layer(s) 420 includes "N" number of hidden layers, where "N" is an integer greater than or equal to one. In turn, each of the hidden layers also includes a set of nodes that are referred to herein as hidden nodes. Example hidden layers include up-sampling, convolutional, fully connected layers, and data transformation layers.

At the lowest level of the hidden layer(s) 420, hidden nodes of that layer are interconnected to the input nodes. At the highest level of the hidden layer(s) 420, hidden nodes of that level are interconnected to the output node. The input nodes are not directly interconnected to the output node(s). If multiple hidden layers exist, the input nodes are interconnected to hidden nodes of the lowest hidden layer. In turn, these hidden nodes are interconnected to the hidden nodes of the next hidden layer and so on and so forth.

An interconnection represents a piece of information learned about the two interconnected nodes. The interconnection has a numeric weight that can be tuned (e.g., based on a training dataset), rendering the neural network 400 adaptive to inputs and capable of learning.

Generally, the hidden layer(s) 420 allows knowledge about the input nodes of the input layer 410 to be shared among the output nodes of the output layer 430. To do so, a transformation $f$ is applied to the input nodes through the hidden layer 420. In an example, the transformation $f$ is non-linear. Different non-linear transformations $f$ are available including, for instance, a rectifier function $f(x)=\max(0,x)$. In an example, a particular non-linear transformation $f$ is selected based on cross-validation. For example, given known example pairs (x, y), where x∈X and y∈Y, a function $f:X \rightarrow Y$ is selected when such a function results in the best matches.

The neural network 400 also uses a loss function l (or, referred to also as a cost function c) to find an optimal solution. The optimal solution represents the situation where no solution has a loss less than the loss of the optimal solution. In an example, the loss function l includes a mean-squared error function that minimizes the average squared error between an output $f(x)$ and a target value y over all the example pairs (x, y). A backpropagation algorithm that uses gradient descent to minimize the loss function is used to train the neural network 400. In an example, the training is a supervised training. During the supervised training, the target value y can be set as the probability distribution parameters for a particular combination of operational conditions and storage conditions. Information about the probability distribution parameters and these conditions can be available as training labels. The output $f(x)$ can be the learned probability distribution parameters based on the particular combination as the input. The goal of the training is to refine the parameters of the neural network to minimize the difference between the target value y and the output $f(x)$.

As such, the hidden layer(s) 420 retains knowledge about the input nodes. A set of knowledge is shared across the output node(s) based on the interconnections of the hidden nodes and the input nodes.

In an illustration, the neural network 400 is a deep learning neural network used for NAND flash memory. To train this network, labeled data is collected by measuring NAND data and cell distribution under certain combinations of operation conditions and memory cell locations. The corresponding probability distribution parameters are also collected. For conditions with continues values, discrete values are generated and used.

The deep leaning neural network is created with "K" input nodes and an output node, where "K" is the number of factors (e.g., features) that define the input conditions. The output node(s) is (are) used to perform an activation function to calculate the probability distribution parameters for a certain combination of input conditions. The number of layers and size of each layer depends on the NAND flash memory and the data amount that this memory can store. The number of layers and size can be selected as hyper-parameters of the training model.

Once trained, a specific combination of operational conditions and storage conditions (e.g., the current conditions) is provided to the deep learning neural network. In turn, the deep learning neural network computes the optimal read threshold voltage for the specific condition. The probability distribution parameters are an output of the deep learning neural network and can be provided to the voltage read threshold generator.

Figure 5:
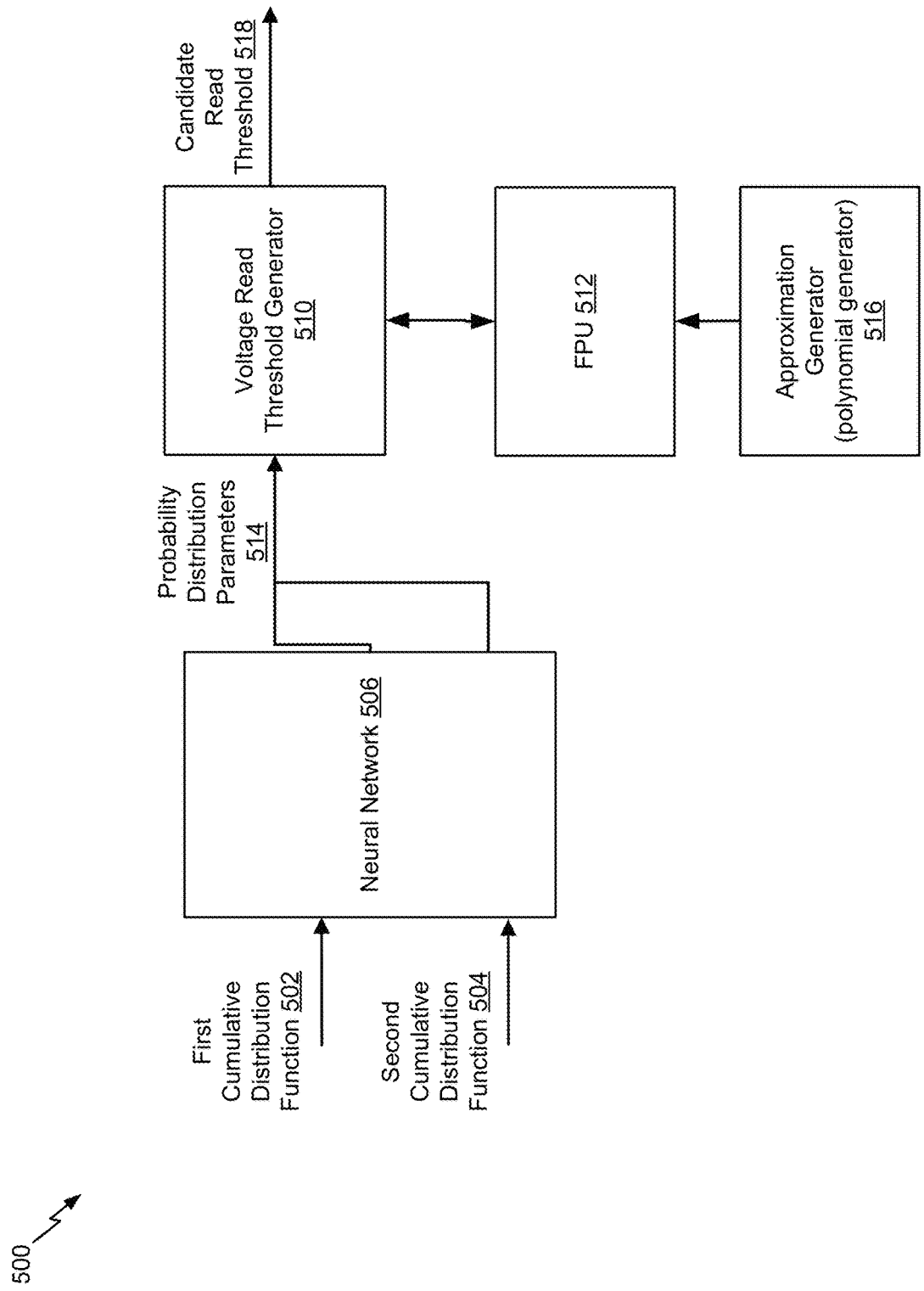
FIG. 5 illustrates an example of a neural network that can be included in generating voltage read thresholds, in accordance with certain embodiments of the present disclosure.

FIG. 5 illustrates an example of a computer system that includes a voltage read threshold generator 510, in accordance with certain embodiments of the present disclosure. In some cases, the computer system could include a storage system such as a solid state drive (SSD). As illustrated, the computer system 500 also includes a first neural network 506, a floating point unit (FPU) 512, and an approximation generator 516 and outputs a candidate read threshold 518. For an n-bit multi-level cell NAND flash memory, a threshold voltage of each cell can be programmed to $2^n$ possible values. In an ideal multi-level cell NAND flash memory, each value corresponds to a non-overlapping threshold voltage range. However, in many systems due to operational conditions, the threshold voltage range for each value may overlap for a portion. An example of this overlap is discussed in additional detail with regard to FIG. 8.

For example, neural network 506 may receive a first cumulative distribution function (CDF) that represents a skew normal distribution model of a first threshold voltage range. The first CDF may be generated by another neural network, iterative modeling to determine a parametric representation of the threshold voltage range. The first CDF 502 may correspond to a first level of the multi-level cell NAND-flash memory. Each multi-level cell has multiple levels based on how many bits are stored in a cell. In one example, a triple level cell (TLC) stores three bits per multi-level cell and has $2^n$ levels, or eight levels. Each of the eight levels of the three-bit TLC correspond to a voltage range that can be represented by a CDF 502. The neural network 506 may receive a second CDF 504 that represents a skew normal distribution model of a second threshold voltage range. The second CDF 504 may correspond to a second level of the multi-level cell. The neural network 506 can be a neural network as described with regard to FIG. 4 and trained to output probability distribution parameters 514. The neural network 506 may output various parameters including, but not limited to a location, a variance, and a skew for each of the first CDF 502 represented by $\Theta_L=(\xi_L, \omega_L, \alpha_L)$ and the second CDF 504 represented by $\Theta_R=(\xi_R, \omega_R, \alpha_R)$. The neural network 506 can provide a first set of parameters $\Theta_L$ that represent the first CDF 502 and a second set of parameters that $\Theta_R$ represent the second CDF 504, collectively "probability distribution parameters 514" to the voltage read threshold generator 510.

The voltage read threshold generator 510 may be a processor to execute firmware-level code. The voltage read threshold generator 510 may receive the probability distribution parameters 514 from the neural network 506. The voltage read threshold generator 510 may generate a voltage read threshold by using the first set of parameters $\Theta_L$ and the second set of parameters $\Theta_R$ as inputs to an objective function. An example of the objective function is a function that has roots at a voltage read threshold (e.g., a cross-point) that minimizes the error rate when reading data stored in a multi-level memory cell.

In one example, the objective function may be represented as $O(x)=f(x; \Theta_L)-f(x; \Theta_R)$, where $f(x; \Theta_L)$ represents a function describing the probability distribution for the first program verify level associated with the first voltage range and the $f(x; \Theta_R)$ represents a function describing the probability distribution for the second program verify level associated with the second voltage range. For instance, a probability distribution function of a skew-normal distribution is equal to $$f(x; \Theta) = \frac{2}{\omega} \cdot \phi\left(\frac{x-\xi}{\omega}\right) \cdot \Phi\left(\alpha \cdot \frac{x-\xi}{\omega}\right);$$

and $$\phi(y) = \frac{1}{\sqrt{2\pi}} e^{-\frac{y^2}{2}}$$

and $$\Phi(y) = \int_{-\infty}^{y} \phi(t) dt.$$

The voltage read threshold generator 510 may determine a logarithmic representation of the objection function that can be approximated by one or more low degree polynomials. The voltage read threshold generator 510 can provide the logarithmic representation of the objective function to a floating point unit. For instance, $t_L(x)$ represents a value from the first program verify level and is computed by $$t_L(x) = \frac{x - \xi_L}{\omega_L}$$

and $t_R(x)$ represents a value from the second program verify level and is computed by $$t_R(x) = \frac{x - \xi_R}{\omega_R}.$$

the voltage read threshold generator 510 may use these terms to compute a logarithmic representation of the objective function $L(x)$ that can be represented by:

$$L(x) = \log\left(\frac{\omega_L}{\omega_R}\right) - \frac{1}{2}((t_L(x))^2 - (t_R(x))^2) + \log(\Phi(\alpha_R \cdot t_R(x))) - \log(\Phi(\alpha_L \cdot t_L(x))).$$

Figure 8:
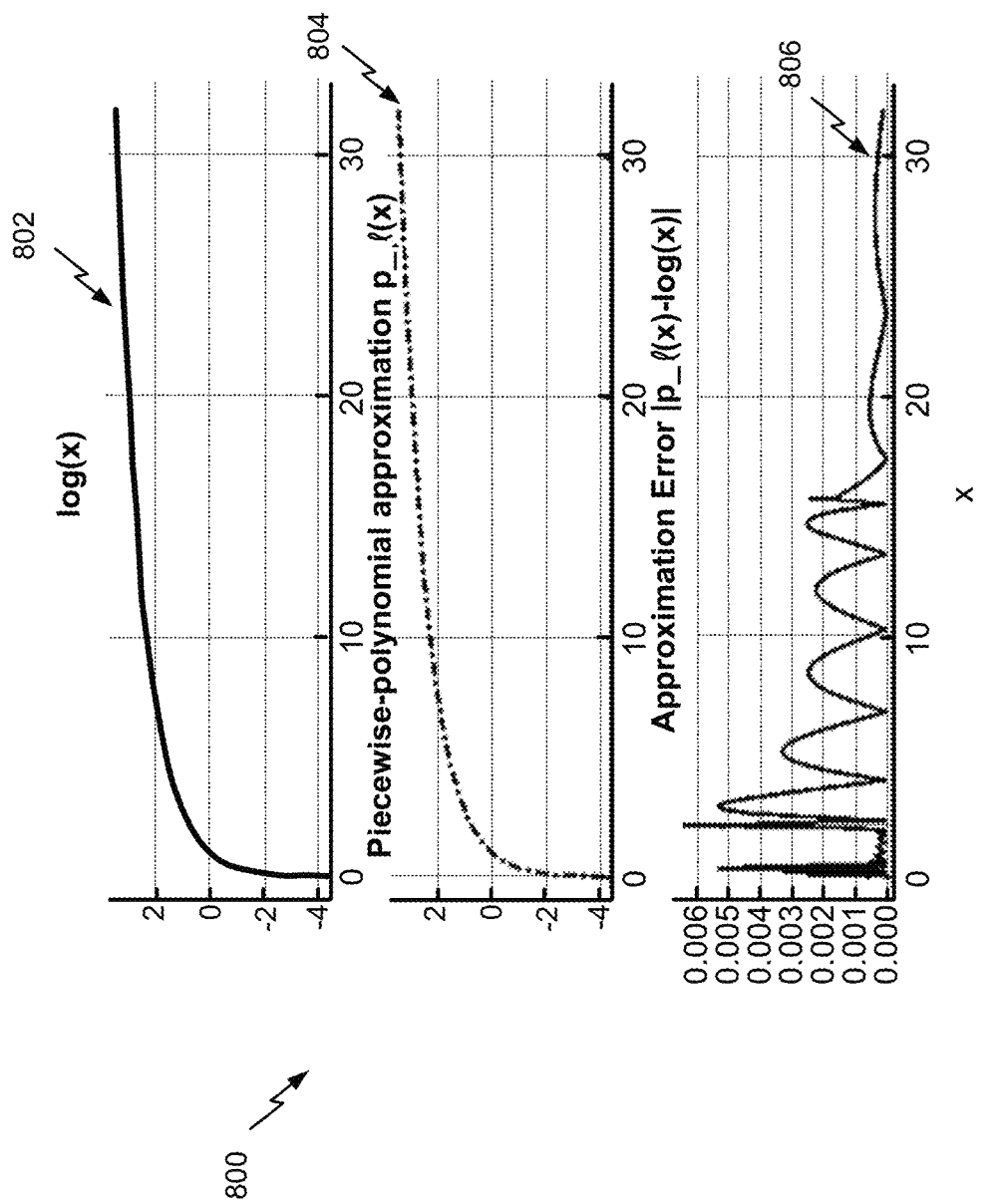
FIG. 8 depicts examples of charts that illustrate the approximation and approximation error for a logarithmic function, according to some embodiments of the present disclosure.
Figure 9:
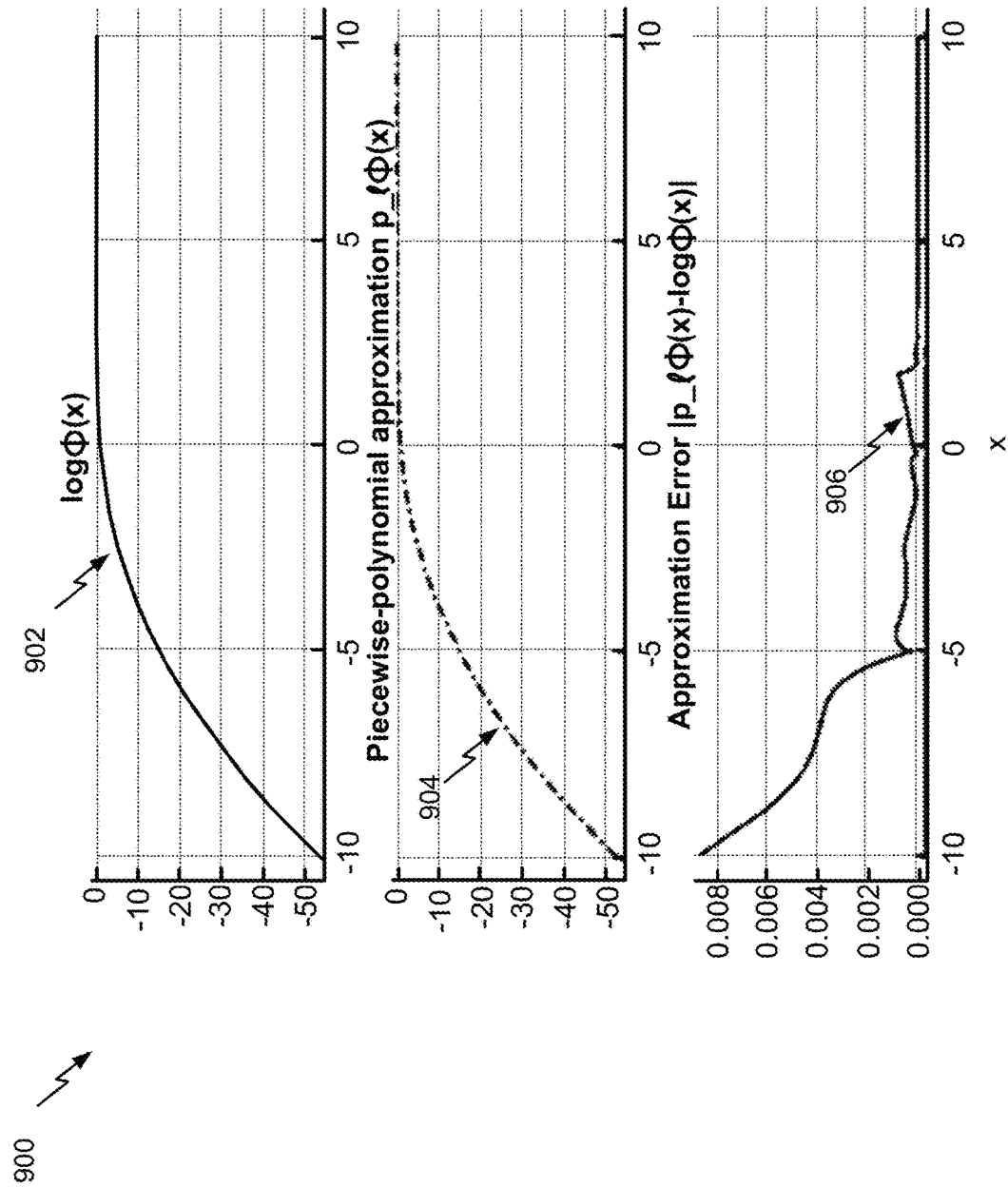
FIG. 9 depicts examples of charts that illustrate the approximation and approximation error for the logarithm of the probability distribution function $\Phi(x)$, according to some embodiments of the present disclosure.

The voltage read threshold generator 510 can evaluate the approximate objective function at one candidate read-threshold with less than 30 multiplication operations. In comparison, a neural network with 4 hidden layers with 128 nodes per layer requires more than 99K MAC operations for evaluating the PDF of the two distributions at one candidate read-threshold. Therefore the proposed scheme reduces the requirement of MAC operations by approximately 3000× and provides a similar level of savings in load-store operations. For instance, the computation of L(x) is made efficient by approximating the functions log(•) and log(Φ(•)) with low-degree polynomials of the function argument such that the coefficients of the polynomials are low-precision floating-point values. For example, $p_l(t)=a_o+a_1t+a_2t^2+\ldots+a_m t^m$ and $p_{l\Phi}(t)=b_0+b_1t+\ldots+b_n t^n$ denote the degree-m and degree-n approximations to log(t) and log(Φ(t)), respectively. These approximations can be made more accurate by partitioning the domain of the function argument and using different polynomials for each range. FIGS. 8 and 9 illustrate examples of a piecewise-approximation of functions log(•) and log(Φ(•)) respectively. In some examples, the polynomials can be evaluated using Horner's method or Estrin's method depending on the pipeline architecture of the processor running the firmware.

The voltage read threshold generator 510 or FPU 512 can evaluate each of the polynomials efficiently using fused multiply-accumulate operations over low-precision floating-point values by the processor running the firmware. The voltage read threshold generator can use the approximation functions to define an approximate objective function represented by:

$$A(x) = p_l\left(\frac{\omega_l}{\omega_r}\right) - \frac{1}{2}((t_L(x))^2 - (t_R(x))^2) + p_{l\Phi}(\alpha_R \cdot t_R(x)) - p_{l\Phi}(\alpha_L \cdot t_L(x))$$

The voltage read threshold generator 510 may also provide the first set of parameters and the second set of parameters to a floating point (FPU) 512. An example of the FPU 512 may be a coprocessor to perform approximation operations at a targeted precision degree. The FPU 512 may receive, from an approximation generator 516 (e.g., a polynomial generator) a set of coefficients for approximating the logarithmic representation of the objective function with low-degree polynomials such that the coefficients are low-precision floating-point values. In one example, the voltage read threshold generator 512 can partition a domain of the objective function for the approximation generator 516 and the FPU 512. The FPU 512 can compute a piece-wise approximation by receiving multiple sets of polynomials from the approximation generator 516 that correspond to a segment of the partitioned domain. The FPU 512 can efficiently use multiple-accumulate operations for each polynomial of the piece-wise approximation. The voltage read threshold generator 510 can generate an approximate objective function. The voltage read threshold generator 510 estimates the roots of the approximate objective function A(x) by evaluating A(x) on one candidate read-threshold and updating the candidate read-threshold until a root of the approximate objective function is determined. In one example, an interval $[x_1, x_2]$ is initialized to $[\xi_L, \xi_R]$, and a first candidate read-threshold is generated at the mid-point of the interval. The voltage read threshold generator 510 updates the interval according to the value of the approximate objective function at the first candidate read-threshold. The first candidate read-threshold corresponds to a candidate voltage read level of the multi-level memory cell. For instance, a first candidate read-threshold corresponds to a voltage level within the voltage range associated with the PV level of the multi-level memory cell.

In another example, the voltage read threshold generator 510 can use the secant method to estimate the candidate read-threshold by estimating the gradient of the approximate objective function A(x) using finite differences for each every iteration and generating the candidate read-threshold using the estimated gradient. For this example, the gradient of the approximate objective function A(x) can be computed accurately as:

$$\frac{\partial A}{\partial x} = \frac{1}{\omega_L}(t_L(x) - \alpha_L \cdot d_{l\Phi}(\alpha_L \cdot t_L(x))) - \frac{1}{\omega_R}(t_R(x) - \alpha_R \cdot d_{l\Phi}(\alpha_R \cdot t_R(x)))$$

where the term $d_{l\Phi}(t)$ is represented by $d_{l\Phi}(t)=b_1+b_2t+b_3t^2+\ldots+b_n t^{n-1}$. The $d_{l\Phi}(t)$ may be a degree-(n−1) polynomial that shares coefficients with polynomial $p_{l\Phi}$. The FPU 512 can evaluate of the polynomial $d_{l\Phi}$ and use the output during the evaluation of the polynomial $p_{l\Phi}$. The voltage read threshold generator 510 uses the gradient at a candidate read-threshold to determine the step-size in Newton's method for convergence to an optimal read-threshold in fewer iterations.

The approximation generator 516 may be a ROM to store polynomial coefficients. In one example, the approximation generator 516 may store half-precision values (i.e 16-bit wide). The approximation generator may use degree-5 polynomials with 5 piecewise approximations of the objective function O(x). Using this configuration, the approximation generator needs total 960 bits of ROM. In comparison, a LUT, which stores 16-bit wide PDF values, needs 512 KiB of ROM when $V_r$–ξ, ω, α are quantized to 64 levels each. Thus, the systems and methods described herein provide more than a 4000× savings in ROM.

Figure 6:
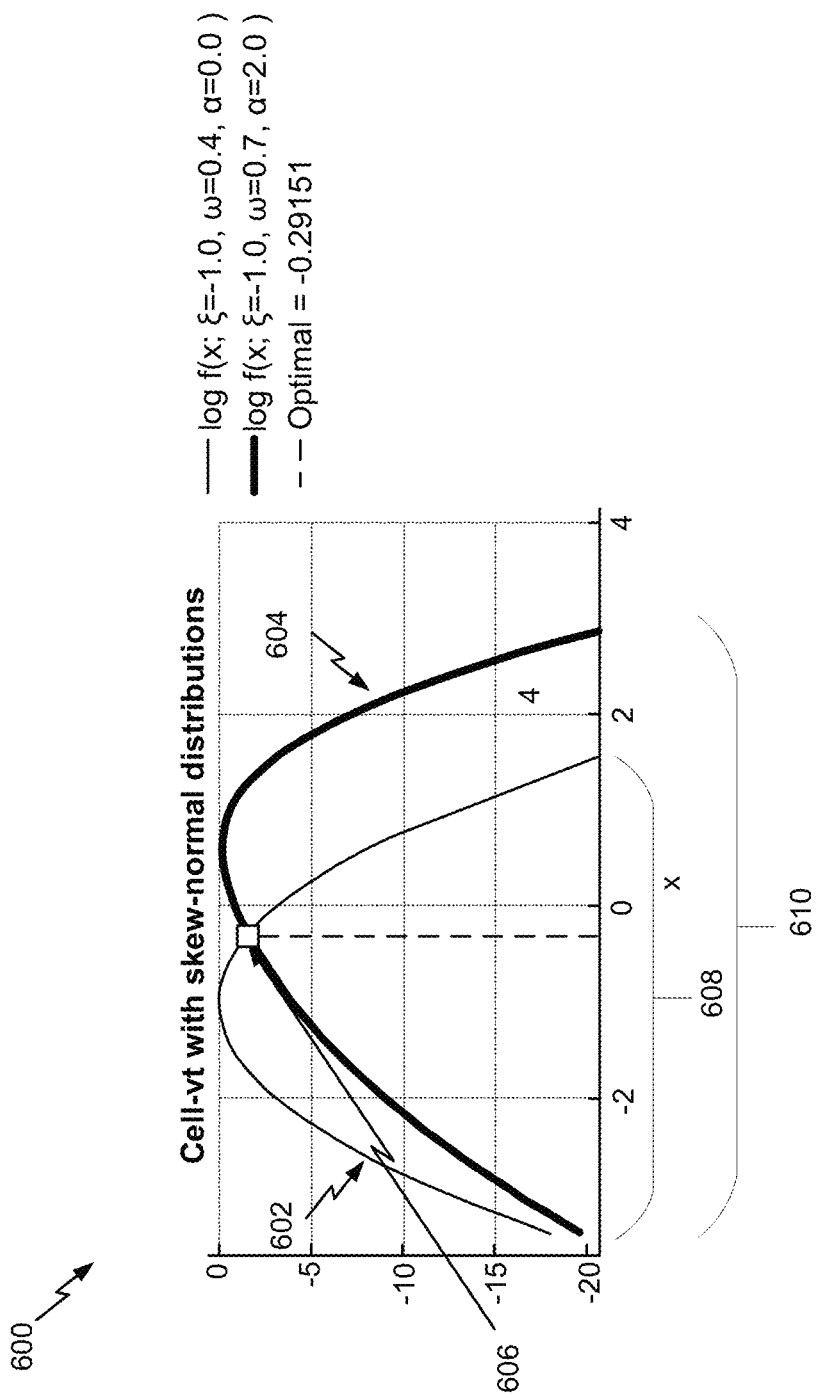
FIG. 6 illustrates an example of a flow generating a voltage read threshold of a memory, in accordance with certain embodiments of the present disclosure.

FIG. 6 depicts a graph 600 of an example voltage read threshold generated according to some embodiments of the present disclosure. For example, graph 600 depicts a first curve 602 that represents a probability distribution, as described with regard to FIG. 5, of the first voltage range 608 and a second curve 604 that represents the second voltage range 610. The voltage threshold generator computes the voltage threshold 606 that is the cross-point between the first voltage range 608 and the second voltage range 610 as illustrated by the intersection of the first curve 602 and the second curve 604. In the example depicted by FIG. 6, the first curve 602 and the second curve 604 depict logarithmic functions of two voltage ranges. Each of the first voltage range 608 and the second voltage range 610 are modelled by a set of skew normal distribution parameters, which are shown in the legend of graph 600.

Figure 7:
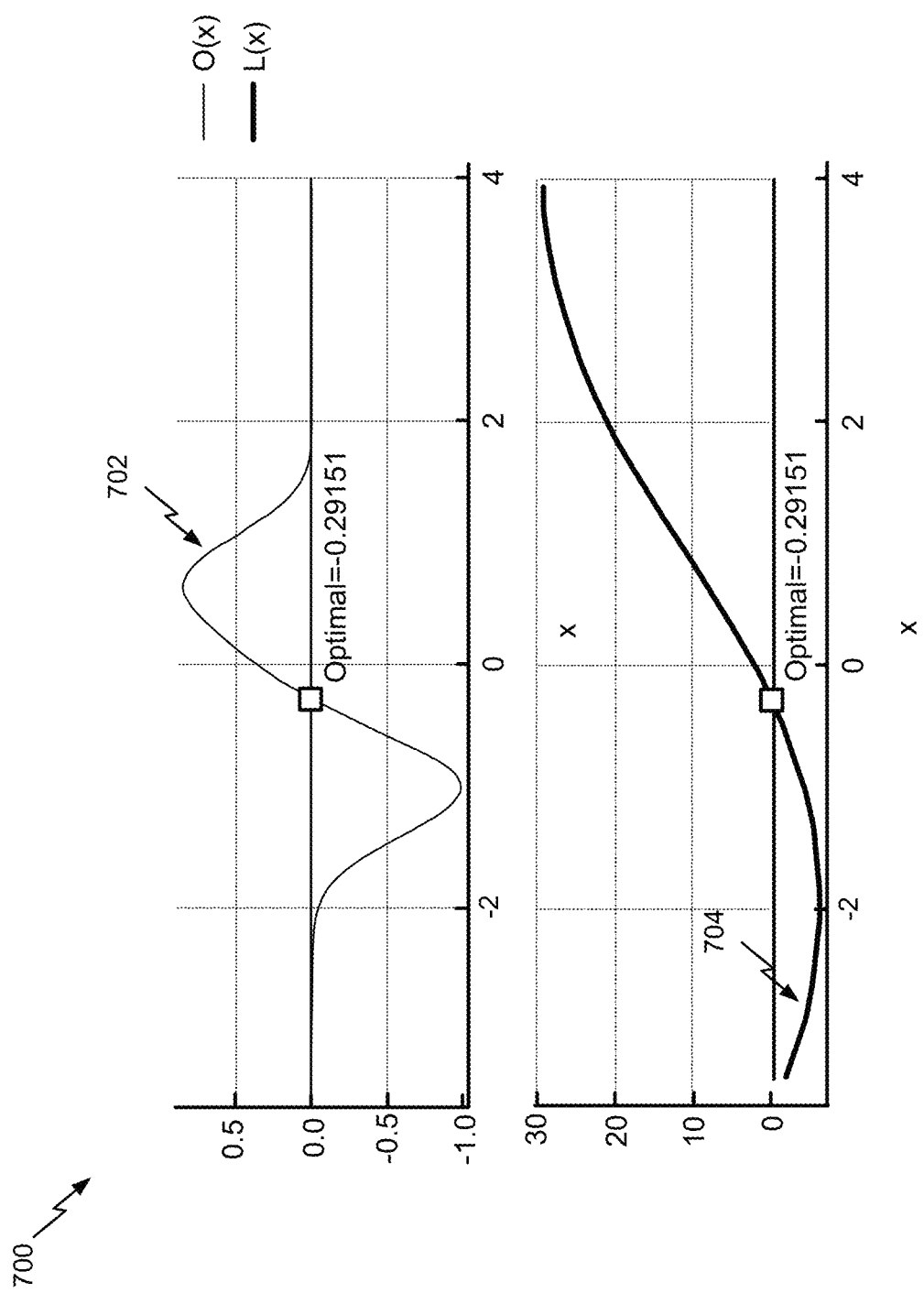
FIG. 7 illustrates an example of a flow for reading a memory location using the voltage read threshold, in accordance with certain embodiments of the present disclosure.

FIG. 7 depicts a graph 700 that depicts an example of an objective function and a logarithmic representation of a difference between two program verify level model curves, according to some embodiments of the present disclosure. For example, the objective function curve 702 may be the objective function described with regard to FIG. 5. A logarithmic representation of a difference curve 704 between a first curve, such as first curve 602, and a second curve (such as second curve 604) may also be computed.

The voltage read threshold generator can generate a root (e.g., the zero-crossing) of the objective function curve 702 or the difference curve 704. However, computing the root of the objective function curve 702 is computationally challenging to execute on firmware. The voltage read threshold generator can compute the root of the difference curve 704, which represents a logarithm of the difference between the first curve 602 and the second curve 604.

FIG. 8 depicts examples of charts that illustrate the approximation and approximation error for a logarithmic function, according to some embodiments of the present disclosure. For example, a first function 802 log(x) can be approximated by using low degree polynomials. In the example of FIG. 8, the first function 802 is approximated using a degree five polynomial. The approximation curve 804 illustrates a piece-wise approximation of the first function 802. The approximation error curve 806 represents an error that is the difference between the approximation curve 804 and the first function 802.

FIG. 9 depicts examples of charts that illustrate the approximation and approximation error for the logarithm of the probability distribution function Φ(x), according to some embodiments of the present disclosure. For example, a second function 902 log (Φ(x)) can be approximated by using low degree polynomials. In some cases, coefficients for the low degree polynomials to approximate the second function are different than the coefficients used for approximating the second function 902. In the example of FIG. 9, the second function 902 is approximated using a degree five polynomial. A second approximation curve 904 illustrates a piece-wise approximation of the second function 902. A second approximation error curve 906 represents an error that is the difference between the second approximation curve 904 and the second function 902.

Figure 10:
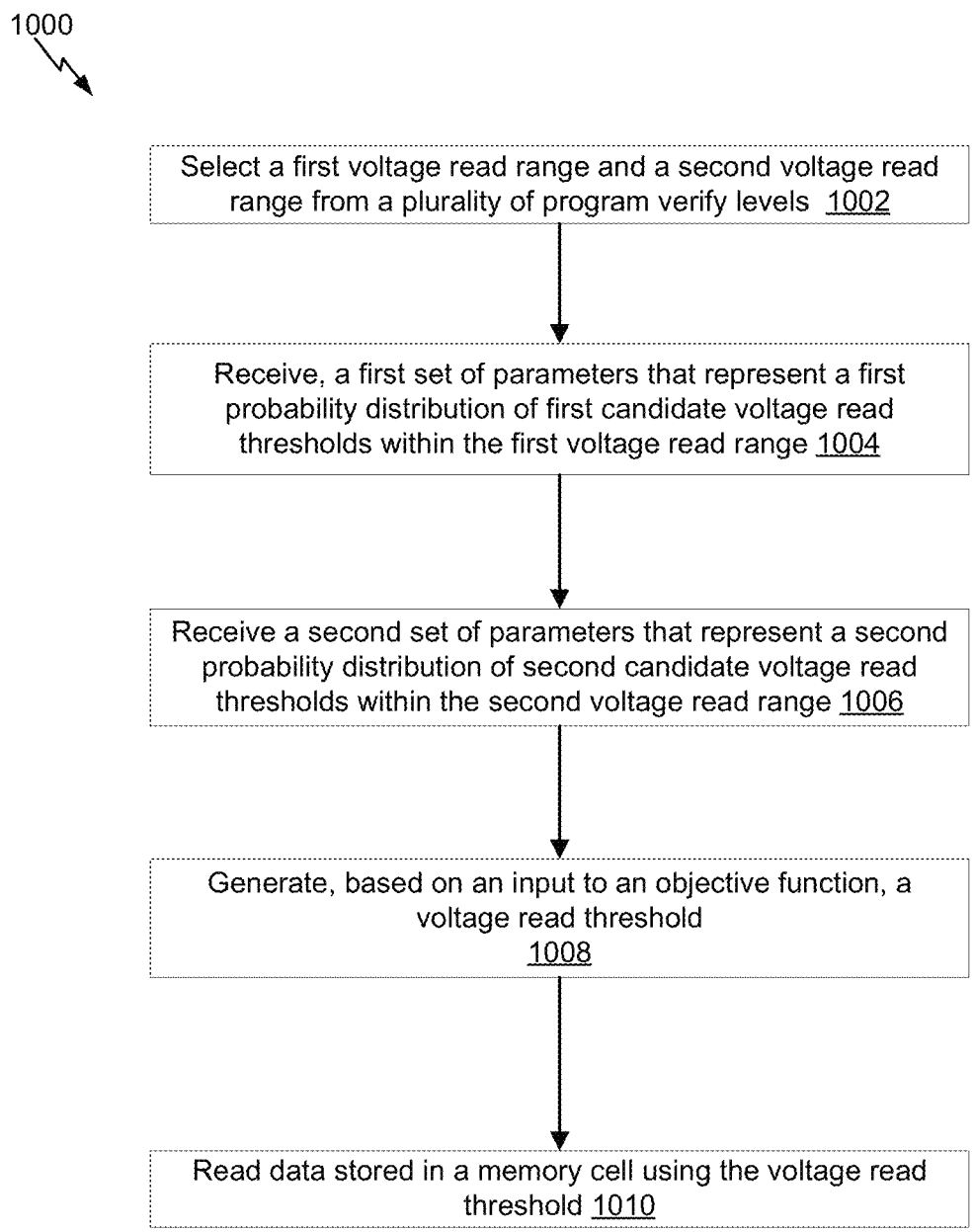
FIG. 10 illustrates an example of a flow for reading a memory location using a threshold read voltage, in accordance with certain embodiments of the present disclosure.

FIG. 10 illustrates an example of a flow 1000 for reading a memory location using a threshold read voltage, in accordance with certain embodiments of the present disclosure. The flow 1000 may start at operation 1002, where the computer system selects a first voltage read range and a second voltage read range from a plurality of program verify (PV) levels. For example, the computer system includes a controller and a memory, such as a NAND flash memory (or some other type of storage device). The controller may store client data in the memory for a client. Doing so includes selecting voltage ranges that correspond to a memory location in a multi-level memory block. In reading from a storage device that has more than one data bit in a memory location, selecting a first voltage read range and a second voltage read range that correspond to respective levels of a memory cell. A respective width of the first voltage read range and the second read range is determined based on a number of bits that can be stored within the memory location.

In one example, the computer system may select a first voltage read range (e.g., 1.8V-2.5V) and a second voltage read range (e.g., 2.5V-3.2V) that may correspond to adjacent PV levels from multiple PV levels. The first voltage read range may correspond to a first PV level that represents a first set of bits stored within the memory location. The second voltage read range may represent a second set of bits, that is different from the first set of bits, stored within the memory location.

At operation 1004, the computer system receives a first set of parameters that represent a first probability distribution of first candidate voltage read thresholds within the first voltage read range. In an example, the computer system receives a first set of parameters that represent a mean, a variable, and a skew of a first probability distribution. The computer system may receive the first set of parameters from a neural network that is trained to determine the mean, variable, and skew that represents a skew distribution from the CDF of an associated PV level.

At operation 1006, the computer system receives a second set of parameters that represent a second probability distribution of second candidate voltage read thresholds within the second voltage read range. In an example, the computer system receives the second set of parameters that represent a mean, a variable, and a skew of a second probability distribution. The computer system may receive the second set of parameters from a neural network that determines a representation of a skew distribution from a cumulative distribution function (CDF) of an associated PV level.

At operation 1008, the computer system generates, based on an input to an objective function, a voltage read threshold. In an example, the computer system generates a voltage read threshold by using the first set of parameters $\Theta_L$ and the second set $\Theta_R$ of parameters as inputs to an objective function. The computer system can generate an approximation function of the objective function and determine roots of the objective function that occurs at a voltage read threshold (e.g., a cross-point).

In one example, the computer system can generate a logarithmic representation of the objection function. The computer system can approximate the logarithmic representation by using one or more low degree polynomials. The computer system may determine the logarithmic representation as described with regard to FIGS. 1-5. The computing system can partition a domain (e.g., an interval of values) of the objective function. The computer system may generate a piece-wise approximation by for each partition of the objective function. The computing system can generate multiple low degree polynomials that correspond to a respective segment of the partitioned domain. The computing system can aggregate the low degree polynomials of the piece-wise approximation into an approximate objective function that includes polynomial terms for each partition of the objective function. The computing system can estimate the roots of the approximate objective function A(x) by evaluating A(x) on various candidate voltage read levels. The candidate voltage read level that is associated with a root of the approximate objective function corresponds to a cross-point voltage level between adjacent PV levels of the multi-level memory cell.

At operation 1010, the computer system reads data stored in a memory cell using the voltage read threshold. In an example, the client data is stored in the memory as a codeword that includes bits based on an ECC encoding procedure. In this example, reading the client data includes decoding the codeword based on an ECC decoding procedure that uses values for the bits based on the voltage read threshold. In particular, the computer system can perform voltage measurements and compare the voltage measurements to the voltage read threshold. Based on the comparison, the computer system determines the logical values of the bits. The logical values, and soft information as applicable, are input to the ECC decoding procedure to decode and output information bits corresponding to the client data.

Figure 11:
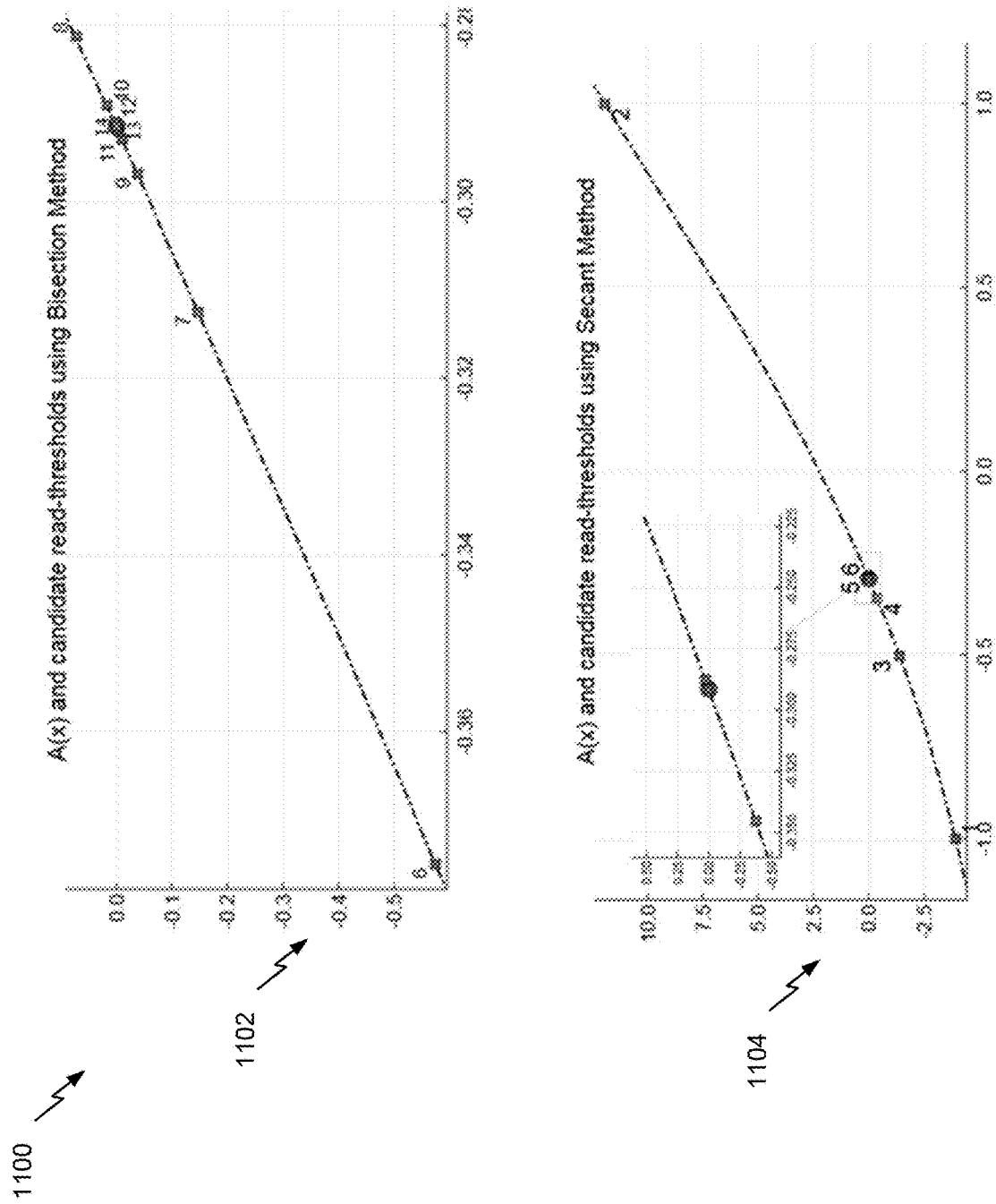
FIG. 11 is an example of graphs depicting an adjustment of a candidate voltage read threshold, in accordance with certain embodiments of the present disclosure.

FIG. 11 is an example of graphs depicting an adjustment a candidate voltage read threshold, in accordance with certain embodiments of the present disclosure. For example, graph 1102 illustrates adjusting the candidate voltage read threshold using a bisection method. The bisection method is a method of finding roots of a continuous function, such as the objective function or the approximate objective function. The bisection method iteratively defines an interval between two values and selects a subinterval within the interval in which the value of the function changes sign. In another example depicted in FIG. 11, graph 1104 illustrates adjusting the candidate voltage read threshold using a secant method. The secant method is a method of finding roots using secant lines of the function. The secant method will converge to a root value when the initial values are sufficiently close to the root of the function.

Figure 12:
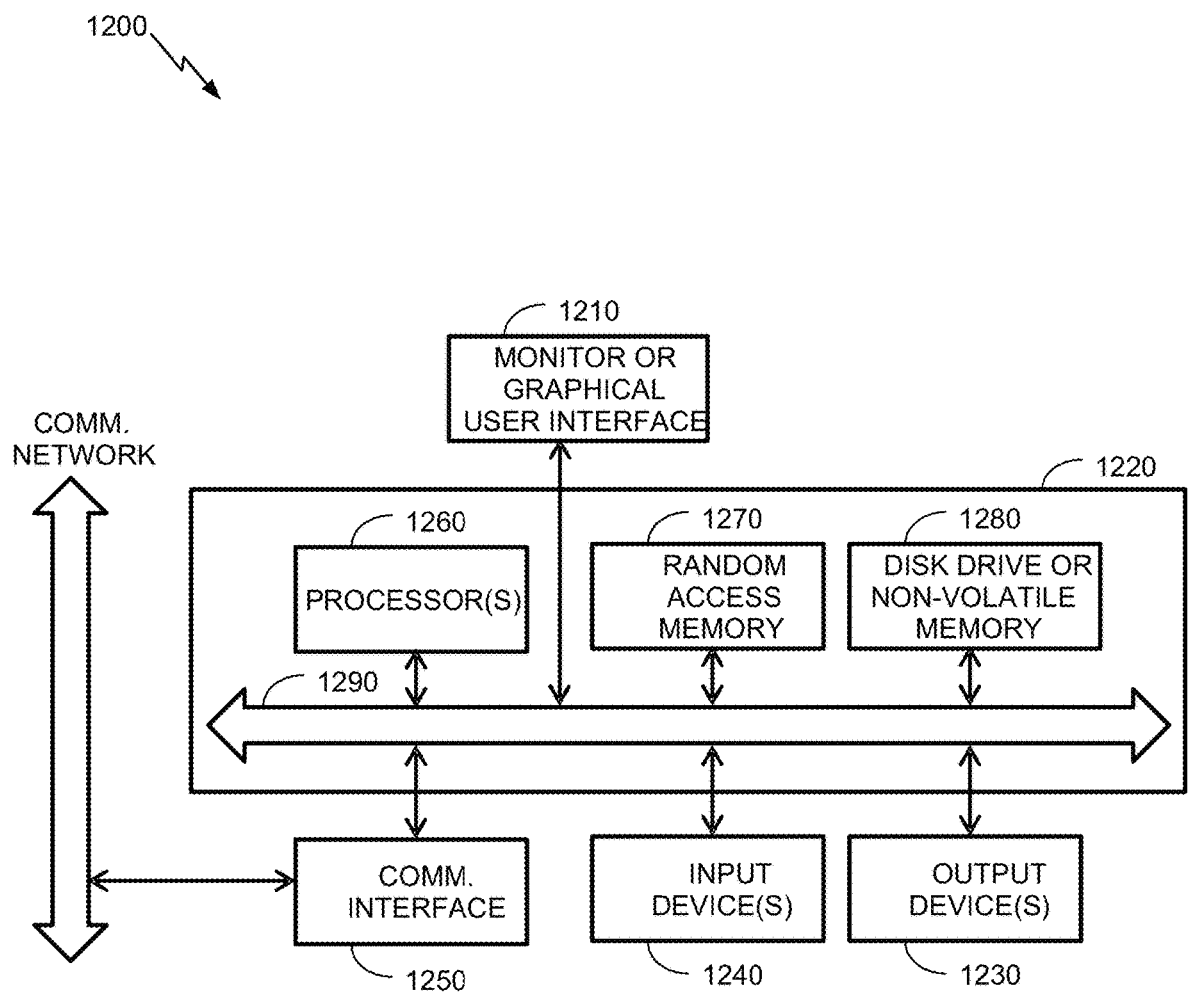
FIG. 12 is an example of a computing system for generating a voltage read threshold, in accordance with certain embodiments of the present disclosure.

FIG. 12 is representative of a computer system 1200 capable of embodying the present disclosure, such as the error correction system 100 of FIG. 1, the host 210 and the storage device 220 of FIG. 2, and the neural network 400 of FIG. 4. FIG. 12 is merely illustrative of an embodiment of the present disclosure and does not limit the scope of the disclosure as recited in the claims. In one embodiment, the system is a computer system 1200 that typically includes a monitor 1210, a computer 1220, user output devices 1230, user input devices 1240, communications interface 1250, and the like. The error correction system 100 of FIG. 1 implements some or all of the components of the computer system 1200.

As shown in FIG. 12, the computer 1220 may include a processor(s) 1260 that communicates with a number of peripheral devices via a bus subsystem 1290. These peripheral devices may include the user output devices 1230, the user input devices 1240, the communications interface 1250, and a storage subsystem, such as random access memory (RAM) 1270 and disk drive 1280.

The user input devices 1240 include all possible types of devices and mechanisms for inputting information to the computer system 1220. These may include a keyboard, a keypad, a touch screen incorporated into the display, audio input devices such as voice recognition systems, microphones, and other types of input devices. In various embodiments, the user input devices 1240 are typically embodied as a computer mouse, a trackball, a track pad, a joystick, a wireless remote, a drawing tablet, a voice command system, an eye tracking system, and the like. The user input devices 1240 typically allow a user to select objects, icons, text and the like that appear on the monitor 1210 via a command such as a click of a button or the like.

The user output devices 1230 include all possible types of devices and mechanisms for outputting information from the computer 1220. These may include a display (e.g., the monitor 1210), non-visual displays such as audio output devices, etc.

The communications interface 1250 provides an interface to other communication networks and devices. The communications interface 1250 may serve as an interface for receiving data from and transmitting data to other systems. Embodiments of the communications interface 1250 typically include an Ethernet card, a modem (telephone, satellite, cable, ISDN), (asynchronous) digital subscriber line (DSL) unit, FireWire interface, USB interface, and the like. For example, the communications interface 1250 may be coupled to a computer network, to a FireWire bus, or the like. In other embodiments, the communications interfaces 1250 may be physically integrated on the motherboard of the computer 1220, and may be a software program, such as soft DSL, or the like.

In various embodiments, the computer system 1200 may also include software that enables communications over a network such as the HTTP, TCP/IP, RTP/RTSP protocols, and the like. In alternative embodiments of the present disclosure, other communications software and transfer protocols may also be used, for example IPX, UDP or the like. In some embodiments, the computer 1220 includes one or more Xeon microprocessors from Intel as the processor(s) 1260. Further, one embodiment, the computer 1220 includes a UNIX-based operating system.

The RAM 1270 and the disk drive 1280 are examples of tangible media configured to store data such as embodiments of the present disclosure, including executable computer code, human readable code, or the like. Other types of tangible media include floppy disks, removable hard disks, optical storage media such as CD-ROMS, DVDs and bar codes, semiconductor memories such as flash memories, non-transitory read-only-memories (ROMS), battery-backed volatile memories, networked storage devices, and the like. The RAM 1270 and the disk drive 1280 may be configured to store the basic programming and data constructs that provide the functionality of the present disclosure.

Software code modules and instructions that provide the functionality of the present disclosure may be stored in the RAM 1270 and the disk drive 1280. These software modules may be executed by the processor(s) 1260. The RAM 1270 and the disk drive 1280 may also provide a repository for storing data used in accordance with the present disclosure.

The RAM 1270 and the disk drive 1280 may include a number of memories including a main random access memory (RAM) for storage of instructions and data during program execution and a read-only memory (ROM) in which fixed non-transitory instructions are stored. The RAM 1270 and the disk drive 1280 may include a file storage subsystem providing persistent (non-volatile) storage for program and data files. The RAM 1270 and the disk drive 1280 may also include removable storage systems, such as removable flash memory.

The bus subsystem 1290 provides a mechanism for letting the various components and subsystems of the computer 1220 communicate with each other as intended. Although the bus subsystem 1290 is shown schematically as a single bus, alternative embodiments of the bus subsystem may utilize multiple busses.

FIG. 12 is representative of a computer system capable of embodying the present disclosure. It will be readily apparent to one of ordinary skill in the art that many other hardware and software configurations are suitable for use with the present disclosure. For example, the computer may be a desktop, portable, rack-mounted, or tablet configuration. Additionally, the computer may be a series of networked computers. Further, the use of other microprocessors are contemplated, such as Pentium™ or Itanium™ microprocessors; Opteron™ or AthlonXP™ microprocessors from Advanced Micro Devices, Inc., and the like. Further, other types of operating systems are contemplated, such as Windows®, WindowsXP®, WindowsNT®, or the like from Microsoft Corporation, Solaris from Sun Microsystems, LINUX, UNIX, and the like. In still other embodiments, the techniques described above may be implemented upon a chip or an auxiliary processing board.

Various embodiments of the present disclosure can be implemented in the form of logic in software or hardware or a combination of both. The logic may be stored in a computer readable or machine-readable non-transitory storage medium as a set of instructions adapted to direct a processor of a computer system to perform a set of steps disclosed in embodiments of the present disclosure. The logic may form part of a computer program product adapted to direct an information-processing device to perform a set of steps disclosed in embodiments of the present disclosure. Based on the disclosure and teachings provided herein, a person of ordinary skill in the art will appreciate other ways and/or methods to implement the present disclosure.

The data structures and code described herein may be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data.

Hardware modules or apparatuses described herein include, but are not limited to, application-specific integrated circuits (ASICs), field-programmable gate arrays (FPGAs), dedicated or shared processors, and/or other hardware modules or apparatuses now known or later developed.

The methods and processes described herein may be partially or fully embodied as code and/or data stored in a computer-readable storage medium or device, so that when a computer system reads and executes the code and/or data, the computer system performs the associated methods and processes. The methods and processes may also be partially or fully embodied in hardware modules or apparatuses, so that when the hardware modules or apparatuses are activated, they perform the associated methods and processes. The methods and processes disclosed herein may be embodied using a combination of code, data, and hardware modules or apparatuses.

Although the foregoing embodiments have been described in some detail for purposes of clarity of understanding, the disclosure is not limited to the details provided. There are many alternative ways of implementing the disclosure. The disclosed embodiments are illustrative and not restrictive.

What is claimed is:

1. A computer-implemented method for reading client data from a memory, the computer-implemented method comprising:
    selecting a first voltage read range and a second voltage read range from a plurality of voltage read ranges that are associated with a number of bits storable in a memory cell, wherein each voltage read range includes a plurality of candidate voltage read levels;
    receiving a first set of parameters that represent a first probability distribution of first candidate voltage read thresholds within the first voltage read range;
    receiving a second set of parameters that represent a second probability distribution of second candidate voltage read thresholds within the second voltage read range;
    generating, based on an input to an objective function, a voltage read threshold, wherein the input comprises the first set of parameters and the second set of parameters, and wherein the voltage read threshold is one of the plurality of candidate voltage read levels; and
    reading data stored in the memory cell based on the voltage read threshold.

2. The computer-implemented method of claim 1, wherein generating the voltage read threshold comprises:
    determining the objective function as a representation of a difference between the first probability distribution and the second probability distribution;
    partitioning the objective function into one or more segments;
    generating at least one approximate objective function that corresponds to a segment of the one or more segments of the objective function; and
    computing an approximation of the voltage read threshold from the at least one approximate objective function.

3. The computer-implemented method of claim 1, wherein the first set of parameters and the second set of parameters are received from a neural network.

4. The computer-implemented method of claim 1, wherein reading data stored in the memory cell comprises:
    determining a voltage level of the memory cell;
    comparing the voltage level to the voltage read threshold; and
    determining one or more bit values of one or more bits stored in the memory cell based on a result of the comparing, the one or more bits representing the data.

5. The computer-implemented method of claim 4, wherein the first voltage read range corresponds to a first bit values set, the second voltage read range corresponds to a second bit values set, and wherein the one or more bit values are determined to be the first bit values set when the voltage level is less than the voltage read threshold.

6. The computer-implemented method of claim 1, wherein the first set of parameters are specific to a first level of a multi-level cell of a memory block, and wherein the first set of parameters includes a mean, a variance, and a skew; and
    and the second set of parameters are specific to a second level of the multi-level cell of the memory block, and wherein the second set of parameters includes a mean, a variance, and a skew.

7. The computer-implemented method of claim 1, further comprising:
    selecting a third voltage read range from the plurality of voltage read ranges;
    receiving a third set of parameters that represent a third probability distribution of third candidate voltage read thresholds within the third voltage read range;
    generating, based on an input to the objective function, a different voltage read threshold, wherein the input comprises the first set of parameters and the third set of parameters, and wherein the different voltage read threshold is one of the third candidate voltage read thresholds; and
    reading additional data stored in the memory cell based on the different voltage read threshold.

8. The computer-implemented method of claim 1, wherein generating the voltage read threshold comprises determining the voltage read threshold based on using one of a bisection method or secant method in resolving the objective function.

9. A non-transitory computer storage medium storing instructions that, upon execution by the non-transitory computer storage medium, perform operations associated with reading client data from a memory, the operations comprising:
    selecting a first voltage read range and a second voltage read range from a plurality of voltage read ranges that are associated with a number of bits storable in a memory cell, wherein each voltage read range includes a plurality of candidate voltage read levels;
    receiving a first set of parameters that represent a first probability distribution of first candidate voltage read thresholds within the first voltage read range;
    receiving a second set of parameters that represent a second probability distribution of second candidate voltage read thresholds within the second voltage read range;
    generating, based on an input to an objective function, a voltage read threshold, wherein the input comprises the first set of parameters and the second set of parameters, and wherein the voltage read threshold is one of the plurality of candidate voltage read levels; and
    reading data stored in the memory cell based on the voltage read threshold.

10. The non-transitory computer storage medium of claim 9, wherein generating the voltage read threshold comprises:
    determining the objective function as a representation of a difference between the first probability distribution and the second probability distribution;

partitioning the objective function into one or more segments;

generating at least one approximate objective function that corresponds to a segment of the one or more segments of the objective function; and computing an approximation of the voltage read threshold from the at least one approximate objective function.

11. The non-transitory computer storage medium of claim 9, wherein the first set of parameters and the second set of parameters are received from a neural network.

12. The non-transitory computer storage medium of claim 9, wherein the operation of reading data stored in the memory cell comprises:

determining a voltage level of the memory cell;

comparing the voltage level to the voltage read threshold; and determining one or more bit values of one or more bits stored in the memory cell based on a result of the comparing, the one or more bits representing the data.

13. The non-transitory computer storage medium of claim 12, wherein the first voltage read range corresponds to a first bit values set, the second voltage read range corresponds to a second bit values set, and wherein the one or more bit values are determined to be the first bit values set when the voltage level is less than the voltage read threshold.

14. The non-transitory computer storage medium of claim 9, wherein the first set of parameters are specific to a first level of a multi-level cell of a memory block, and wherein the first set of parameters includes a mean, a variance, and a skew; and and the second set of parameters are specific to a second level of the multi-level cell of a memory block, and wherein the second set of parameters includes a mean, a variance, and a skew.

15. The non-transitory computer storage medium of claim 9, wherein the operations further comprise:

selecting a third voltage read range from the plurality of voltage read ranges;

receiving a third set of parameters that represent a third probability distribution of third candidate voltage read thresholds within the third voltage read range;

generating, based on an input to the objective function, a different voltage read threshold, wherein the input comprises the first set of parameters and the third set of parameters, and wherein the different voltage read threshold is one of the third candidate voltage read thresholds; and reading additional data stored in the memory cell based on the different voltage read threshold.

16. A system comprising:

a non-transitory computer storage medium storing instructions that, upon execution by the non-transitory computer storage medium, perform operations associated with reading client data from a memory, the operations comprising:

selecting a first voltage read range and a second voltage read range from a plurality of voltage read ranges that are associated with a number of bits storable in a memory cell, wherein each voltage read range includes a plurality of candidate voltage read levels;

receiving a first set of parameters that represent a first probability distribution of first candidate voltage read thresholds within the first voltage read range;

receiving a second set of parameters that represent a second probability distribution of second candidate voltage read thresholds within the second voltage read range;

generating, based on an input to an objective function, a voltage read threshold, wherein the input comprises the first set of parameters and the second set of parameters, and wherein the voltage read threshold is one of the plurality of candidate voltage read levels; and reading data stored in the memory cell based on the voltage read threshold.

17. The system of claim 16, wherein the operation of generating the voltage read threshold comprises:

determining the objective function as a representation of a difference between the first probability distribution and the second probability distribution;

partitioning the objective function into one or more segments;

generating at least one approximate objective function that corresponds to a segment of the one or more segments of the objective function; and computing an approximation of the voltage read threshold from the at least one approximate objective function.

18. The system of claim 16, wherein the first set of parameters and the second set of parameters are received from a neural network.

19. The system of claim 16, wherein the operation of reading data stored in the memory cell comprises:

determining a voltage level of the memory cell;

comparing the voltage level to the voltage read threshold; and determining one or more bit values of one or more bits stored in the memory cell based on a result of the comparing, the one or more bits representing the data.

20. The system of claim 19, wherein the first voltage read range corresponds to a first bit values set, the second voltage read range corresponds to a second bit values set, and wherein the one or more bit values are determined to be the first bit values set when the voltage level is less than the voltage read threshold.

* * * * *